United States Patent [19]

Miura et al.

[11] Patent Number: 4,846,541
[45] Date of Patent: Jul. 11, 1989

[54] INTERFERENCE FILM FILTER AND AN OPTICAL WAVEGUIDE AND A METHOD FOR PRODUCING THE SAME

[75] Inventors: Yuuji Miura, Hitachi; Noboru Baba, Hitachioota, both of Japan

[73] Assignee: Hitachi, Ltd., Tokyo, Japan

[21] Appl. No.: 112,944

[22] Filed: Oct. 27, 1987

[30] Foreign Application Priority Data

Oct. 31, 1986 [JP] Japan .................. 61-258284

[51] Int. Cl.$^4$ .................. G02B 5/28; G02B 6/10
[52] U.S. Cl. .................. 350/96.12; 350/164; 350/96.34; 427/163; 204/192.29
[58] Field of Search .................. 350/96.12, 96.34, 163, 350/164, 166; 427/163, 166; 204/192.1, 192.11, 192.12, 192.15, 192.26, 192.29

[56] References Cited

U.S. PATENT DOCUMENTS

| | | | |
|---|---|---|---|
| 3,910,681 | 10/1975 | Elliott et al. | 350/164 X |
| 3,914,023 | 10/1975 | Thelen | 350/164 |
| 3,962,062 | 6/1976 | Ingrey | 350/164 X |
| 4,012,119 | 3/1977 | Adams et al. | 350/164 X |
| 4,451,119 | 5/1984 | Meyers et al. | 350/607 |
| 4,615,033 | 9/1986 | Nakano et al. | 350/164 X |
| 4,623,228 | 11/1986 | Galasso et al. | 350/609 |
| 4,673,629 | 6/1987 | Yamazaki et al. | 430/66 X |
| 4,707,820 | 11/1987 | Sawamura | 350/164 X |

FOREIGN PATENT DOCUMENTS 60-37504 2/1985 Japan .
60-87302 5/1985 Japan .
60-114811 6/1985 Japan .

*Primary Examiner*—John D. Lee
*Attorney, Agent, or Firm*—Antonelli, Terry & Wands

[57] ABSTRACT

An interference film filter and an optical waveguide including a laminate which are deposition-formed by alternate lamination of a first thin film (2,4,10) of amorphous $Si_xC_yO_z$ (x:y:z=1:0.6–1:0–0.5) having refractive index up to 3.4 and a extinction coefficient below 0.1 and a second thin film (3,5,20) of amorphous $Si_xO_yC_z$ (x:y:z=1:1.8–2:0–0.5) having a low refractive index in comparison with that of the first thin film, thereby loss of light of the resultant interference film filter and the optical waveguide is reduced.

36 Claims, 1 Drawing Sheet

INTERFERENCE FILM FILTER AND AN OPTICAL WAVEGUIDE AND A METHOD FOR PRODUCING THE SAME

BACKGROUND OF THE INVENTION

The present invention relates to an interference film filter used such as for an optical multiplexer and demultiplexer in optical communication systems and optical microscopes and to an optical waveguide used such as for optical measurement systems and optical integrated circuits and relates to a method for producing the interference film filter and the optical waveguide.

Japanese Patent Laid-Open No. 60-87302 (1985) discloses an interference film filter including alternative lamination of a thin $TiO_2$ film having a high refractive index of 2.2 and a thin $SiO_2$ film having a low refractive index of 1.46.

Japanese Patent Laid-Open No. 60-114811 (1985) (U.S. Ser. No. 06/674,770, filed on Nov. 26, 1984 and assigned to the present assignee, now U.S. Pat. No. 4,737,015 disclosed a stepped and a graded optical waveguide including an oxynitride film composed of silicon oxide and silicon nitride having a high refractive index of 1.72 at a wavelength of 0.633 μm, the wavelength generated by He-Ne gas laser and forming a core portion and an oxynitride film composed of silicon oxide and silicon nitride having a low refractive index of 1.65–1.69 at a wavelength of 0.633 μm and forming a clad portion. The oxynitride films are deposition-formed by sputtering a polycrystalline silicon in a sputter gas containing $O_2$ and $N_2$ gases, and refractive indexes of the oxynitride films are controlled by adjusting the $O_2$ gas content in the sputter gas.

Japanese Patent Laid-Open No. 60-37504 (1985) discloses a stepped and a graded optical waveguide comprising a core portion formed of an alternate lamination of a thin $TiO_2$ film having a high refractive index of 2.3 and a thin $SiO_2$ film having a low refractive index of 1.477 at a wavelength of 0.633 μm. The laminate is then heat-treated to form a core portion having a uniform composition and a refractive index between 1.477 and 2.3.

In the interference film filter and the optical waveguide, when a thin film having a high refractive index n with thickness d exhibits a local maximum transmittance at a wavelength λ, the following equation generally holds;

$$d = \lambda/4n(2m+1)(m=0,1,2,3,\ldots)$$

The above equation indicates that the film thickness be decreased with the increase in refractive index of the film. On one hand, loss of light in general decreases with the decrease in thickness of the film.

Loss of light in the interference film filter and the optical waveguide is further reduced in dependence upon extinction coefficient specific to a material of thin film. The extinction coefficient represents a degree of light absorption in the thin film material, in that, the smaller the extinction coefficient, the smaller the loss of light in the thin film. Until now, it was considered that the extinction coefficient of an optical material in general increases in dependence upon an increase of the refractive index thereof.

Refractive index and extinction coefficient of the conventionally used $TiO_2$ thin film for the interference film filter and the optical waveguide are respectively 2.3 and 0.5–1.0, which are not necessarily satisfactory for the reduction of loss of light in the interference film filter and the optical waveguide.

SUMMARY OF THE INVENTION

One object of the present invention is to provide an interference film filter and an optical waveguide with a small loss of light.

Another object of the present invention is to provide an interference film filter and an optical waveguide which comprise a high refractive index thin film or a core having a higher refractive index and a smaller extinction coefficient than those of the conventional $TiO_2$ thin film.

Further object of the present invention is to provide a method for producing an interference film filter and an optical waveguide with reduced production time and production cost.

An interference film filter and an optical waveguide of the present invention includes a substrate such as glass, plastic and silicon wafer and a laminate supported on the substrate, the laminate is formed of at least one alternative lamination of a first thin film of amorphous $Si_xC_yO_z$ having a high refractive index of up to 3.4, wherein $x > 0$, $y > z$ and $z \geq 0$ and a second thin film having a low refractive index in comparison with that of the first thin film. The amounts of y and z in the amorphous $Si_xC_yO_z$ are preferably in a range of 0.6–1 and 0–0.5 respectively when assumed x is 1. The second thin film is preferably to be amorphous $Si_xO_yC_z$, wherein $x > 0$, $y > z$, and $z \geq 0$, and the amounts of y and z thereof are preferably in a range of 1.8–2 and 0–0.5 respectively when assumed x is 1.

A method of the present invention for producing an interference film filter and an optical waveguide including a substrate and a laminate supported on the substrate, the laminate being formed by sputtering deposition of at least one alternative lamination of a first thin film having a high refractive index and a second thin film having a low refractive index in comparison with that of the first thin film comprises a step of depositing an amorphous $Si_xC_yO_z$ film, wherein y is 0.6–1 and z is 0–0.5 when assumed x is 1, by sputtering an SiC sinter target and controlling the ratio of $O_2$ gas content in a mixture sputter gas of an inert gas such as argon (Ar), helium (He), neon (Ne), Krypton (Kr) and xenon (Xe) and oxygen gas in a range of 0–5 wt % so as to constitute the first thin film, and a step of depositing an amorphous $Si_xO_yC_z$ film, wherein y is 1.8–2 and z is 0–0.05 when assumed x is 1 by sputtering the same common SiC sinter target and controlling the ratio of $O_2$ gas content in the mixture sputter gas in a range of 10–20wt % so as to constitute the second thin film.

The resultant thin film of amorphous $Si_xC_yO_z$ exhibits a refractive index of upto 3.4 at a wavelength of 0.633 μm, which is very higher than the refractive index 2.3 of the $TiO_2$ thin film, and an extinction coefficient below 0.1, which is very smaller than the extinction coefficient 0.5 to 1.0 of the $TiO_2$ thin film.

The resultant thin film of amorphous $Si_xO_yC_z$ exhibits substantially the equivalent properties of the $SiO_2$ thin film in that a refractive index of 1.4 to 1.5 at a wavelength of 0.633 μm and an extinction coefficient of substantial zero.

The thin film of amorphous $Si_xO_yC_z$, which constitutes the low refractive index thin film or the clad portion of the present invention, may be replaced by the conventional thin film forming materials by sputtering having a low refractive indexes such as $SiO_2$ and oxynitride composed of silicon oxide and silicon nitride, wherein the sputtering target and the sputter gas have to be changed for the film formation, which prolongs the production time and increases the production cost, as well as interrupts the continuous operation, moreover during exchange of the sputter target, dust is likely to deposit on the surface of the previously formed film to reduce the quality of the resultant product.

DESCRIPTION OF THE PREFERRED EMBODIMENTS

Figure 1:
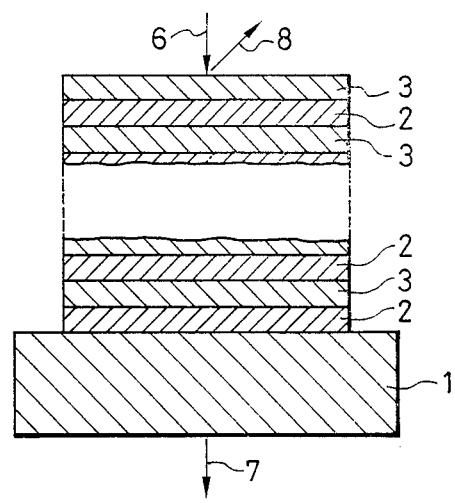
FIG. 1 shows a sectional view of one embodiment of an interference film filter according to the present invention.

The interference film filter shown in FIG. 1 was produced as follows,

On the glass substrate 1, an amorphous $Si_xC_y$ film 2 (x=0.6, y=0.4) having thickness of 490Å was deposited by sputtering in an argon gas with an SiC sinter target for 2.5 minutes, wherein sputter power was 200W and sputter gas pressure was $1\times10^{-2}$ Torr. Then, the same SiC sinter target was sputtered in a mixture sputter gas consisting of argon gas and 15wt % of oxygen for 5 minutes in order to deposit an amorphous $Si_xO_y$ film 3 (x=0.4, y=0.8) having thickness of 1000 Å. By repeating the above operation a laminate having alternate lamination of the films 2 and 3 in a number of several tens of films supported on the glass substrate 1 was produced.

The amorphous $Si_xC_y$ film 2 (x=0.6, y=0.4) and the amorphous $Si_xO_y$ film 3 (x=0.4, y=0.8) exhibited refractive indexes 3.2 and 1.4 respectively.

Arrows indicated by numerals 6, 7 and 8 respectively show the directions of an incident light, a transmitted light and a reflected light to the resultant interference film filter.

Figure 2:
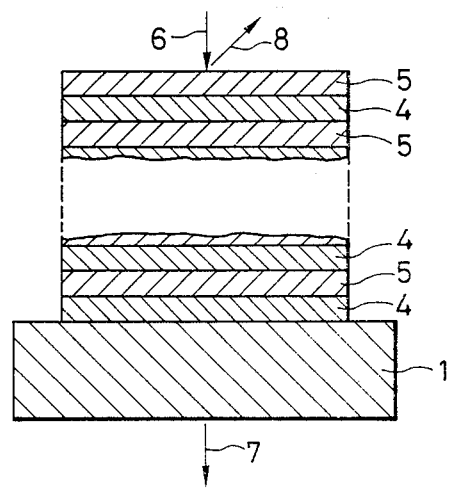
FIG. 2 shows a sectional view of another embodiment of an interference film filter according to the present invention and FIG. 3 shows a sectional view of one embodiment of an optical waveguide according to the present invention.

The method of producing the interference film filter shown in FIG. 2 is substantially the same as of FIG. 1, in that, on the glass substrate 1, an amorphous $Si_xC_yO_z$ film 4 (x=0.5, y=0.4, z=0.2) having thickness of 630 Å was deposited by sputtering in a mixture sputter gas consisting of argon gas and 5 wt % of oxygen using the same SiC sinter target for 3 minutes, wherein sputter power was 200 W and sputter gas pressure was $1\times10^{-2}$ Torr. Then, an amorphous $Si_xO_yC_z$ film 5 (x=0.4, y=0.8, z=0.1) having thickness of 980Å was deposited on the film 4 using the same SiC sinter target and a mixture sputter gas consisting of argon gas and 10 wt % of oxygen for 5 minutes. By repeating the above operation, the amorphous $Si_xC_yO_z$ films 4 and the amorphous $Si_xO_yC_z$ films 5 were alternatingly laminated upon one another in a number of several tens of films.

The amorphous $Si_xC_yO_z$ film 4 (x=0.5, y=0.4, z=0.2) and the amorphous $Si_xO_yC_z$ film 5 (x=0.4, y=0.8, z=0.1) exhibited refractive indexes 2.5 and 1.6 respectively.

Arrows indicated by numerals 6.7 and 8 respectively show the directions of an incident light, a transmitted light and a reflected light to the resultant interference film filter.

Figure 3:
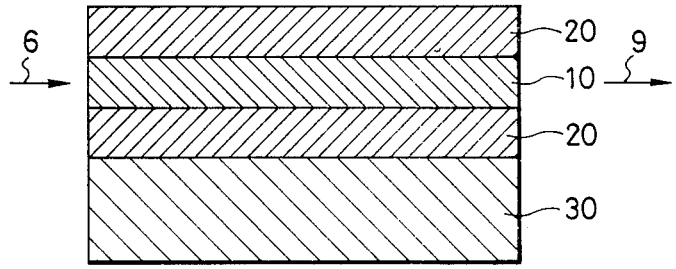

The optical waveguide shown in FIG. 3 was produced in a manner substantially the same as of the interference film filter shown in FIGS. 1 and 2, in that, on a glass substrate 30, an amorphous $Si_xO_yC_z$ film 20 (x:y:z=1:1.8–2:0–0.5) having thickness of 5–30 μm, which constitutes a clad portion, was deposited by sputtering in a mixture sputter gas consisting of argon gas and 10–20 wt % of oxygen for 250–1500 minutes, wherein sputter power was 200 W and sputter gas pressure was $1\times10^{-2}$ Torr. Then the same common SiC sinter target was sputtered in a mixture sputter gas consisting of argon gas and 0–5 wt % of oxygen for 50–500 minutes in order to deposit an amorphous $Si_xC_yO_z$ film 10 (x:y:z =1:0.6–1:0–0.5) having thickness of 1–10 μm, which constitutes a core position, on the amorphous $Si_xO_yC_z$ film 20 formed previously. Finally the same common SiC sinter target again was sputtered to deposit an amorphous $Si_xO_yC_z$ film 20 (x:y:z =1:1.8–2:0–0.5) on the amorphous $Si_xC_yO_z$ film 10 formed previously under the same condition for the formation of the amorphous $Si_xO_yC_z$ film 20 formed previously.

The resultant amorphous $Si_xC_yO_z$ film 10 and the amorphous $Si_xO_yC_z$ film 20 exhibited refractive indexes 1.8–3.2 and 1.4–1.8 respectively.

Arrows indicated by numerals 6 and 9 respectively show the directions of an incident light and a guided light to the resultant optical waveguide.

Although, the embodiment of FIG. 3 shows a stepped type optical waveguide, however a core portion having a predetermined refractive index distribution is easily formed to constitute a graded type optical waveguide in that by using the common SiC sinter target and controlling non-stepwisely the oxygen concentration ratio in the mixture sputter gas, amorphous $Si_xC_yO_z$ film or amorphous $Si_xO_yC_z$ film having refractive index ranging from 1.4 to 3.4 is freely deposition-formed through the method of the present invention.

Whether the resultant deposition films explained above are in the forms of amorphous $Si_xC_yO_z$ and amorphous $Si_xO_yC_z$ was analyzed and confirmed by an ion micro analyzer, an electron microscope and an infrared absorption spectrum.

We claim:

1. An optical waveguide including a substrate and a laminate supported on said substrate, said laminate being formed of a lamination of alternating layers including at least a first thin film of amorphous $Si_xC_yO_z$, wherein x>o, y>z and z>o, and a second thin film having a low refractive index in comparison with that of said first thin film.

2. An optical waveguide according to claim 1, wherein said second thin film is amorphous $Si_xO_yC_z$, wherein x>o, y>z and z, and z $\geq$ o.

3. An optical waveguide according to claim 2, wherein y is 0.6–1 and o<z$\leq$0.5 of said amorphous $Si_xC_yO_z$ when x is 1 and y is 1.8–2 and z is 0–0.5 of said amorphus $Si_xO_yC_z$ when x is 1.

4. An optical waveguide according to claim 1, wherein y is 0.6–1 and o<z $\leq$0.5 of said amorphous $Si_xC_yO_z$ when x is 1.

5. An optical waveguide according to claim 1, wherein said substrate is made of transparent material.

6. An optical waveguide according to claim 1, wherein said substrate is made of a silicon wafer.

7. An optical waveguide including a substrate and a laminate supported on said substrate, said laminate being formed of a lamination of alternating layers including at least a first thin film of amorphous $Si_xC_yO_z$ wherein $x<0$, $y<z$ and $z\geqq0$, and a second thin film of amorphous $Si_xO_yC_z$, wherein $x>0$, $y>z$ and $z>0$.

8. An optical waveguide according to claim 7, wherein y is 0.6–1 and $0\leqq z\leqq0.5$ of said amorphous $Si_xC_yO_z$ when x is 1.

9. An optical waveguide according to claim 7, wherein y is 0.6–1 and $o\leqq z\leqq0.5$ of said amorphous $Si_xC_yO_z$ when x is 1 and y is 1.8–2 and $o<z\leqq0.5$ of said amorphous $Si_xO_yC_z$ when x is 1.

10. An optical waveguide according to claim 7, wherein said substrate is made of transparent material.

11. An optical waveguide according to claim 7, wherein said substrate is made of a silicon wafer.

12. An interference film filter including a substrate and a laminate supported on said substrate, said laminate being formed of at least one lamination of alternating layers including a first thin film of amorphous $Si_xC_yO_z$, wherein $x>0$, $y>z$ and $z\leqq0$, and a second thin film having a low refractive index in comparison with that of said first thin film.

13. An interference film filter according to claim 12, wherein
said second thin film is amporphous $Si_xO_yC_z$, wherein $x>0$, $y>z$ and $z\geqq0$.

14. An interference film filter according to claim 13 wherein, y is 0.6–1 and $o<z\leqq0.5$ of said amorphous $Si_xC_yO_z$ when x is 1 and y is 1.8–2 and z is 0–0.5 of said amorphous $Si_xO_yC_z$ when x is 1.

15. An interference film filter according to claim 14 wherein the thicknesses of the respective first thin films are substantially the same, and the thicknesses of the respective second thin films are substantially the same.

16. An interference film filter according to claim 15 wherein said substrate is made of transparent material.

17. An interference film filter according to claim 12 wherein y is 0.6–1 and $o<z\leqq0.5$ of said amorphous $Si_xC_yO_z$ when x is 1.

18. An interference film filter according to claim 12, wherein said laminate comprises a plurality of laminations of said first thin film and said second thin film.

19. An interference film filter including a substrate and a laminate supported on said substrate, said laminate being formed of at least one lamination of alternating layers including a first thin film of amorphous $Si_xC_yO_z$, wherein $x>0$, $y>z$ and $z\geqq0$, and a second thin film of amorphous $Si_xO_yC_z$, wherein $x>0$, $y>z$ and $z>0$. said second thin film having a low refractive index in comparison with that of said first thin film.

20. An interference film filter acccording to claim 19, wherein, y is 0.6–1 and $0\leqq z\leqq0.5$ of said amorphous $Si_xC_yO_z$ when x is 1.

21. An interference film filter according to claim 11, wherein y is 0.6–1 and $o\leqq z\leqq0.5$ of said amorphous $Si_xC_yO_z$ when x is 1 and y is 1.8–2 and $o<z\leqq0.5$ of said amorphous $Si_xO_yC_z$ when x is 1.

22. An interference film filter according to claim 21, wherein the thicknesses of the respective first thin films are substantially the same, and the thicknesses of the respective second thin films are substantially the same.

23. An interference film filter according to claim 22, wherein said substrate is made of transparent material.

24. An interference film filter according to claim 19, wherein said laminate comprises a plurality of laminations of said first thin film and said second thin film.

25. A method for producing an optical waveguide comprising:

a step of setting oxygen gas content in a range of 0–5 wt % in a mixture sputter gas of an inert gas an the oxygen gas in a sputtering chamber;

a step of depositing a first thin film on a substrate by sputtering a common SiC sinter target;

a step of resetting oxygen gas content in a range of 10–20 wt % in the mixture sputter gas; and a step of depositing a second thin film on the first thin film by sputtering the common SiC sinter target;

wherein the first thin film is amorphous $Si_xC_yO_z$, wherein $0.6\leqq y\leqq1$ and $o<z\leqq0.5$ when x is 1, and the second thin film is amorphous $Si_xO_yC_z$, wherein $1.8\leqq y\leqq2.0$ and $o\leqq z0.5$ when x is 1.

26. A method for producing an optical waveguide comprising:

a step of setting oxygen gas content in a range of 0–5 wt % in a mixture sputter gas of an inert gas and the oxygen gas in a sputtering chamber;

a step of depositing a first thin film on a substrate by sputtering a common SiC sinter target;

a step of resetting oxygen gas content in a range of 10–20 wt % in the mixture sputter gas; and a step of depositing a second thin film on the first thin film by sputtering the common SiC sinter target;

wherein the first thin film is amorphous $Si_xC_yO_z$, wherein $0.6\leqq y\leqq1$ and $o\leqq z\leqq0.5$ when x is 1, and the second thin film is amorphous $Si_xO_yC_z$, wherein $1.8\leqq y\leqq2.0$ and $o<z\leqq0.5$ when x is 1.

27. A method for producing an optical waveguide comprising:

a step of setting oxygen gas content in a range of 10–20 wt % in a mixture sputter gas of an inert gas and the oxygen gas in a sputtering chamber;

a step of depositing a first thin film on a substrate by sputtering a common SiC sinter target;

a step of resetting oxygen gas content in a range of 0–5 wt % in the mixture sputter gas;

a step of depositing a second thin film on the first thin film by sputtering the common SiC sinter target;

a step of resetting oxygen gas content in a range of 10–20 wt % in the mixture sputtering gas; and a step of depositing a third thin film on the second thin film by sputtering the common SiC sinter target;

wherein the first thin film and the third thin film are amorphous $Si_xO_yC_z$, wherein $1.8\leqq y\leqq2.0$ and $o\leqq z\leqq 0.5$ when x is 1, and the second thin film is amorphous $Si_xC_yO_z$, wherein $0.6\leqq y\leqq1$ and $o<z\leqq0.5$ when x is 1.

28. A method for producing an optical waveguide comprising:

a step of setting oxygen gas content in a range of 10–20 wt % in a mixture sputter gas of an inert gas and the oxygen gas in a sputtering chamber;

a step of depositing a first thin film on a substrate by sputtering a common SiC sinter target;

a step of resetting oxygen gas content in a range of 0–5 wt % in the mixture sputter gas;

a step of depositing a second thin film on the first thin film by sputtering the common SiC sinter target;

a step of resetting oxygen gas content in a range of 10–20 wt % in the mixture sputter gas; and a step of depositing a third thin film on the second thin film by sputtering the common SiC sinter target;

wherein the first thin film and the third thin film are amorphous $Si_xO_yC_z$, wherein $1.8\leqq y\leqq2.0$ and $o<z\leqq0.5$ 0.5 when x is 1, and the second thin film is amorphous $Si_xC_yO_z$, wherein $0.6 \leq y \leq 1$ and $o \leq z \leq 0.5$ when x is 1.

29. A method for producing an interference film filter comprising:
- a step of setting oxygen gas content in a range of 0-5 wt % in a mixture sputter gas of an inert gas and the oxygen gas in a sputtering chamber;
- a step of depositing a first thin film on a substrate by sputtering a common SiC sinter target;
- a step of resetting oxygen gas content in a range of 10-20wt % in the mixture sputter gas; and
- a step of depositing a second thin film on the first thin film by sputtering the common SiC sinter target,
- wherein the first thin film is amorphous $Si_xC_yO_z$, wherein $0.6y \leq 1$ and $o \leq z 0.5$ when x is 1, and the second thin film is amorphous $Si_xO_yC_z$, wherein $1.8 \leq y \leq 2.0$ and $o < z \leq 0.5$ when x is 1.

30. A method for producing an interference film filter according to claim 29, wherein all the steps are repeated to form a plurality of alternating first thin films and second thin films.

31. A method for producing an interference film filter comprising:
- a step of setting oxygen gas content in a range of 10-20 wt % in a mixture sputter gas of an inert gas and the oxygen gas in a sputtering chamber;
- a step of depositing a first thin film on a substrate by sputtering a common SiC sinter target;
- a step of resetting oxygen gas content in a range of 0-5 wt % in the mixture sputter gas; and
- a step of depositing a second thin film on the first thin film by sputtering the common SiC sinter target,
- a step of resetting oxygen gas content in a range of 0-5 wt % in the mixture sputter gas; and
- a step of depositing a second thin film on the first thin film by sputtering the common SiC sinter target,
- wherein the first thin film is amorphous $Si_xO_yC_z$, wherein $1.8 \leq y \leq 2.0$ and $o \leq z \leq 0.5$ when x is 1, and the second thin film is amorphous $Si_xC_yO_z$, wherein $0.6 \leq y \leq 1$ and $o < z \leq 0.5$ when x is 1.

32. A method for producing an interference film filter according to claim 31, wherein all the steps are repeated to form a plurality of alternating first thin films and second thin films.

33. A method for producing an interference film filter comprising:
- a step of setting oxygen gas content in a range of 0-5 wt % in a mixture sputter gas of an inert gas and the oxygen gas in a sputtering chamber;
- a step of depositing a first thin film on a substrate by sputtering a common SiC sinter target;
- a step of resetting oxygen gas content in a range of 10-20 wt % in the mixture sputter gas; and
- a step of depositing a second thin film on the first thin film by sputtering the common SiC sinter target;
- wherein the first thin film is amorphous $Si_xC_yO_z$, wherein $0.6 \leq y \leq 1$ and $o < z \leq 0.5$ when x is 1, and the second thin film is amorphous $Si_xO_yC_z$, wherein $1.8 \leq y \leq 2.0$ and $o \leq z \leq 0.5$ when x is 1.

34. A method for producing an interference film filter according to claim 33, wherein all the steps are repeated to form a plurality of alternating first thin films and second thin films.

35. A method for producing an interference film filter comprising:
- a step of setting oxygen gas content in a range of 10-20 wt % in a mixture sputter gas of an inert gas and the oxygen gas in a sputtering chamber;
- a step of depositing a first thin film on a substrate by sputtering a common SiC sinter target;
- a step of resetting oxygen gas content in a range of 0-5 wt % in the mixture sputter gas; and
- a step of depositing a second thin film on the first thin film by sputtering the common SiC sinter target;
- wherein the first thin film is amorphous $Si_xO_yC_z$; wherein $1.8 \leq y \leq 2.0$ and $o < z \leq 0.5$ when x is 1, and the second thin film is amorphous $Si_xC_yO_z$, wherein $0.6 \leq y \leq 1$ and $o \leq z \leq 0.5$ when x is 1.

36. A method for producing an interference film filter according to claim 35, wherein all the steps are repeated to form a plurality of alternating first thin films and second thin films.

* * * * *